United States Patent [19]
Mertol

[11] Patent Number: 6,011,304
[45] Date of Patent: Jan. 4, 2000

[54] STIFFENER RING ATTACHMENT WITH HOLES AND REMOVABLE SNAP-IN HEAT SINK OR HEAT SPREADER/LID

[75] Inventor: Atila Mertol, Cupertino, Calif.

[73] Assignee: LSI Logic Corporation, Milpitas, Calif.

[21] Appl. No.: 08/850,292

[22] Filed: May 5, 1997

[51] Int. Cl.[7] ............................ H01L 23/96; H01L 23/40; H01L 23/08
[52] U.S. Cl. ........................ 257/706; 257/704; 257/710; 257/712; 257/726; 257/727; 257/718; 257/738
[58] Field of Search ................................ 257/706, 704, 257/710, 625, 717, 720, 712, 734, 737, 738, 726, 727, 722, 718, 713; 361/719, 704; 174/16.3

[56] References Cited

U.S. PATENT DOCUMENTS

| | | | |
|---|---|---|---|
| 5,182,632 | 1/1993 | Bechtel et al. | 257/713 |
| 5,227,663 | 7/1993 | Patil et al. | 257/706 |
| 5,230,759 | 7/1993 | Hiraiwa | 257/706 |
| 5,384,940 | 1/1995 | Soule et al. | 361/719 |
| 5,455,462 | 10/1995 | Marrs | 257/796 |
| 5,552,635 | 9/1996 | Kim et al. | 257/706 |
| 5,619,399 | 4/1997 | Mok | 257/718 |
| 5,625,222 | 4/1997 | Yoneda et al. | 257/706 |
| 5,642,265 | 6/1997 | Bond et al. | 361/809 |
| 5,691,041 | 11/1997 | Frankeny et al. | 257/712 |

FOREIGN PATENT DOCUMENTS

| | | | |
|---|---|---|---|
| 59-65457 | 4/1984 | Japan . | |
| 62-37950 | 2/1987 | Japan | 257/704 |
| 63-293958 | 11/1988 | Japan | 257/704 |
| 1-57738 | 3/1989 | Japan | 257/704 |
| 2-205347 | 8/1990 | Japan | 257/718 |
| 2-246142 | 10/1990 | Japan | 257/718 |
| 4-116853 | 4/1992 | Japan | 257/704 |
| 4-186752 | 7/1992 | Japan | 257/718 |
| 5-267485 | 10/1993 | Japan | 257/704 |
| 6-120366 | 4/1994 | Japan | 257/704 |

*Primary Examiner*—Alexander Oscar Williams
*Attorney, Agent, or Firm*—Fitch, Even, Tabin & Flannery

[57] ABSTRACT

An electronic semiconductor device package, the package comprising: a substrate having traces; a die attached to the substrate; first level interconnects of the die to the traces of the substrate; and a stiffener attached to the substrate, wherein the stiffener comprises at least one hole. A system for attaching a heat dissipater to an electronic semiconductor device package, the system comprising: a stiffener of the electronic package comprising at least one hole, wherein the stiffener is attachable to the electronic package; a heat dissipater comprising at least one pin, wherein the pin is engagable with the hole. A method of attaching a heat sink to an electronic semiconductor device package, the method comprising: attaching a stiffener to the package, wherein the stiffener comprises at least one hole; positioning a heat dissipater adjacent the stiffener, wherein the heat dissipater comprises at least one pin; and engaging the pin with the hole, wherein the heat dissipater is secured to the stiffener by the pin and hole. An electronic semiconductor device package, the package comprising: a substrate having a top and bottom surface and having traces; a die attached to the top surface of the substrate; first level interconnects of the die to the traces of the substrate; a stiffener having a top, bottom and opening, attached at the bottom to the top of the substrate, wherein the die is inside the opening, and wherein the stiffener comprises at least one hole in the top; encapsulant within the opening of the stiffener which covers the die and first level interconnects; and a heat dissipater adjacent the stiffener and encapsulant, wherein the heat dissipater comprises at least one pin that protrudes from the heat dissipater and engages the hole of the stiffener, whereby the pin and hole secure the heat dissipater to the stiffener.

19 Claims, 8 Drawing Sheets

STIFFENER RING ATTACHMENT WITH HOLES AND REMOVABLE SNAP-IN HEAT SINK OR HEAT SPREADER/LID

TECHNICAL FIELD

This invention relates to electronic semiconductor packages or assemblies, especially devices for attaching heat dissipaters (heat sinks and heat spreader lids) to electronic semiconductor packages.

BACKGROUND OF THE INVENTION

Electronic semiconductor packages are well-known and are configured in several different ways. Typically, an electronic semiconductor package includes: a silicon chip (die) containing circuit elements; a substrate, for example, a printed circuit board (PCB); first level interconnects which connect the die and the substrate, i.e., wirebonds, Tape Automated Bonds (TAB) and Controlled Collapse Chip Connection (C4 or flip chip bonds); and second level interconnects, such as external metal pins or solder balls, which connect the substrate to printed wiring circuit cards. Substrates comprise ceramic or plastic materials depending of the particular application. Some semiconductor packages have encapsulant which coats the die and the first level interconnects for protection. A dam or stiffener ring may also be used to hold the encapsulant in place around the die and interconnects as it hardens.

A cross-sectional view of a typical cavity-up electronic semiconductor package is shown in FIG. 1. A semiconductor chip or die 1 is attached to a substrate 2 by die attach epoxy 1a. The die 1 electrically communicates with the traces 3 of the substrate 2 by bond wires 4. A stiffener ring 11 surrounds the die 1 and is attached also to the substrate 2 by epoxy 1a. Encapsulant 6 resides within the stiffener ring 11 and over the die 1 and wirebonds 4. A layer of epoxy 7 is spread over the encapsulant 6 and stiffener ring 11 and a heat sink 8 is attached thereto by the epoxy 7. Solder balls 9 attach the substrate 2 to a printed wiring circuit card, not shown.

During operation, energy is lost in the form of heat which builds up in the electronic semiconductor packages. As junction temperatures increase, reliability and speed are sacrificed. Because failure processes accelerate with increased temperature, the life of each junction becomes shorter as the temperature increases. It is generally well-known to provide means for dissipating heat from the electronic semiconductor package. It is particularly important to dissipate heat from electronic packages with semiconductor devices which operate at high speeds and high power levels.

The path of heat dissipation is considered in two parts: junction-to-case path and case-to-ambient path. The junction-to-case path usually conducts heat directly from the die to a package surface through an encapsulant epoxy. Then the heat is convected from the semiconductor package case to a surrounding ambient (case-to-ambient path) either by natural convection or forced convection. The case-to-ambient heat transfer is enhanced by increasing surface area exposed to ambient air. This is accomplished by employing heat sinks which have many configurations. Fluids such as air, water, etc. are passed over the heat sink to exchange heat from the heat sink surface to the fluid or ambient.

Because the heat dissipation effectiveness of a heat dissipation device is dependent on the thermal resistance of the path between the package and the heat sink, the means of attaching the heat sink to the package is critically important. Typically, heat dissipaters are constructed from a high thermal conductivity material, such as copper, aluminum or high thermal conductivity plastic. They are attached to the packages with thermally conductive adhesive or epoxy, such as "LOCTITE-384" produced by Loctite Corp. However, if an adhesive is used to attach the heat dissipater, the heat dissipater is difficult to detach.

In many applications, it is not known prior to actual use whether a particular electronic package requires a heat dissipation device. In order to reduce production costs, it is desirable to add heat dissipation devices only to packages where necessary. Therefore, heat dissipation devices must have the ability to be added to the package after the package has been attached to the printed wiring card with which it is being used.

Further, detachable heat dissipaters are desirable in applications where it is necessary to remove damaged or defective packages. For example, packages which comprise solder balls as second level interconnects, referred to as "ball grid array" (BGA) packages, may only be removed from a wiring card by heating the solder balls to a melting temperature of the solder (reflow temperature). If the package has a non-detachable heat dissipater, more heat is required to melt the solder balls since the heat dissipater absorbs most of the heat provided due to high thermal capacitance of the heat dissipater material. The high intensity heat necessary to melt the solder balls causes damage, in many cases, to surrounding components on the wiring card. A detachable heat dissipater, however, provides easy access to the defective package by removing the heat dissipaters before providing sufficient heat to melt the solder balls. Therefore, less heat is required, compared to a non-detachable heat dissipater package, to melt the solder balls.

Some packages have heat dissipaters which are attached with screws. The screws extend from the heat dissipater into the substrate. These packages require a sufficiently thick substrate to support the screws, which in many applications is undesirable.

Alternatively, as shown in FIGS. 2A and 2B, a clip attachment device is shown for attaching a heat sink to an electronic semiconductor package. FIG. 2B is a cross-sectional view of the embodiments shown in FIG. 2A across line A—A The clip 10 extends from one side of the semiconductor chip package to the other. In particular, the ends of the clip 10 curve around the edges of the package to engage the underside of the substrate 2. However, in this configuration, the clip 10 interferes with the solder balls 9 so that fewer input/output solder balls are available for use. Further, as shown in FIGS. 3A and 3B, in packages which employ a dam ring 5, the encapsulant 6 forms a mound over the die. FIG. 3B is a cross-sectional view of the embodiment shown in FIG. 3A across line B—B. These are called "glob-top" packages. The heat sink 8 only contacts the package at the top of the encapsulant 6 in the center of the package. The ends of the clip 10 pull the edges of the substrate in the opposite direction to the force exerted by the heat sink 8 on the encapsulant 6. This generates a significant bending moment in the substrate.

Regardless of whether a package employs a stiffener or a dam ring, this method of clipping adds additional stress to the package substrate which warps the semiconductor package. This warpage is most significant in "glob-top" packages. Further, the clip, which wraps around and engages the edge of the substrate, interferes with the second level interconnects. This interference is particularly detrimental in the case of a ball grid array package.

Therefore, there is a need for a detachable heat dissipater attachment device which does not generate additional warpage of the package or interfere with the second level interconnects.

SUMMARY OF THE INVENTION

In accordance with one embodiment of the invention, there is provided a stiffener with holes and a heat dissipater with pins for attaching the heat dissipater to the stiffener. This stiffener is attached to the package and supports the package to reduce or prevent package warpage and prevents an attachment clip from interfering with second level interconnects. In particular, the removable snap-in heat dissipater is easily attached to the package top surface by snapping the pins of the heat dissipater into holes provided in the stiffener, either before or after the package is attached to the printed wiring card. Since holes are provided on each side of the stiffener, directional independent attachment of heat sinks is possible. Also, since the heat dissipater is not directly clipped to the thin package substrate, there is less bending moment and stress on the package edge. The invention therefore allows greater latitude in the design of the substrate because thinner substrates are possible and traces at the bottom surface of the package substrate may be extended to the very edge of the substrate without interference by a clip. Thus, the present invention provides flexible, less expensive thermal enhancement to semiconductor packages.

According to an additional aspect of the invention, there is provided an electronic semiconductor device package, the package comprising: a substrate having traces; a die attached to the substrate; first level interconnects of the die to the traces of the substrate; and a stiffener attached to the substrate, wherein the stiffener comprises at least one hole.

According to a still further aspect of the invention, there is provided a system for attaching a heat dissipater to an electronic semiconductor device package, the system comprising: a stiffener of the electronic package comprising at least one hole, wherein the stiffener is attachable to the electronic package; a heat dissipater comprising at least one pin, wherein the pin is engagable with the hole.

According to an alternative aspect of the invention, there is provided a method of attaching a heat sink to an electronic semiconductor device package, the method comprising: attaching a stiffener to the package, wherein the stiffener comprises at least one hole; positioning a heat dissipater adjacent the stiffener, wherein the heat dissipater comprises at least one pin; and engaging the pin with the hole, wherein the heat dissipater is secured to the stiffener by the pin and hole.

According to an even further aspect of the invention, there is provided an electronic semiconductor device package, the package comprising: a substrate having a top and bottom surface and having traces; a die attached to the top surface of the substrate; first level interconnects of the die to the traces of the substrate; a stiffener having a top, bottom and opening, attached at the bottom to the top of the substrate, wherein the die is inside the opening, and wherein the stiffener comprises at least one hole in the top; encapsulant within the opening of the stiffener which covers the die and first level interconnects; and a heat dissipater adjacent the stiffener and encapsulant, wherein the heat dissipater comprises at least one pin that protrudes from the heat dissipater and engages the hole of the stiffener, whereby the pin and hole secure the heat dissipater to the stiffener.

The stiffener of the invention may be employed in connection with any existing or contemplated electronic systems including integrated circuit devices and semiconductor devices with or without packages, multi-chip modules, flip-chip devices, substrate structures and other forms of electronic component devices and systems that benefit from being cooled.

BRIEF DESCRIPTION OF THE DRAWINGS

The present invention is better understood by reading the following description of nonlimitative embodiments, with reference to the attached drawings wherein like parts in each of the several figures are identified by the same reference character, and which are briefly described as follows.

It is to be noted, however, the appended drawings illustrate only typical embodiments of this invention and are therefore not to be considered limiting of its scope, as the invention may admit to other equally effective embodiments.

DETAILED DESCRIPTION OF THE INVENTION

Figure 1:
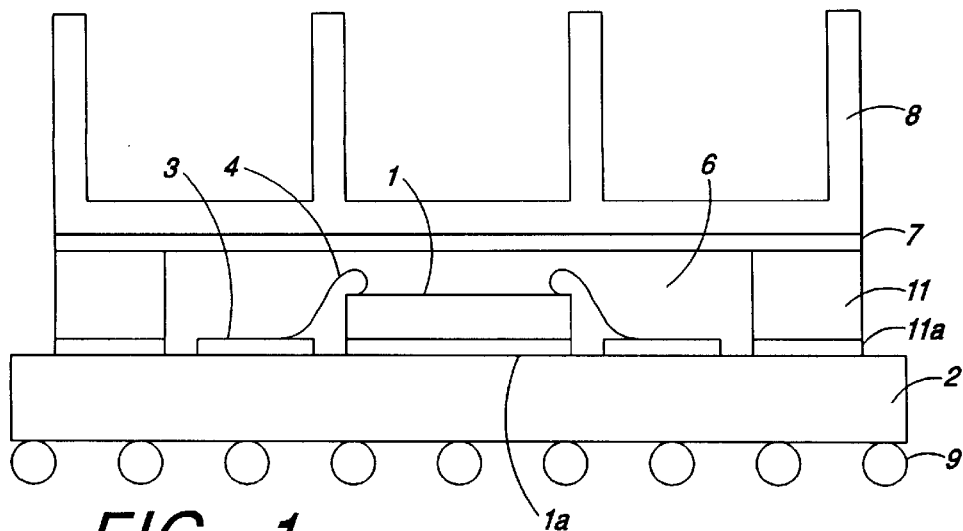
FIG. 1 is a cross-section side view of an electronic semiconductor package with heat sink.
Figure 2A:
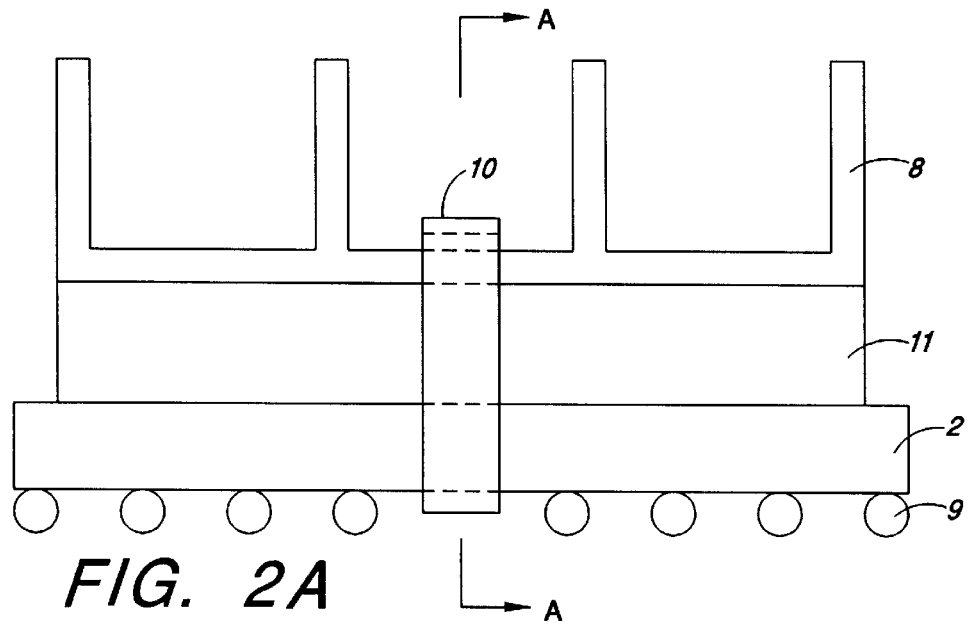
FIG. 2A is a side view of an electronic semiconductor device package with a heat sink attached by a clip.
Figure 2B:
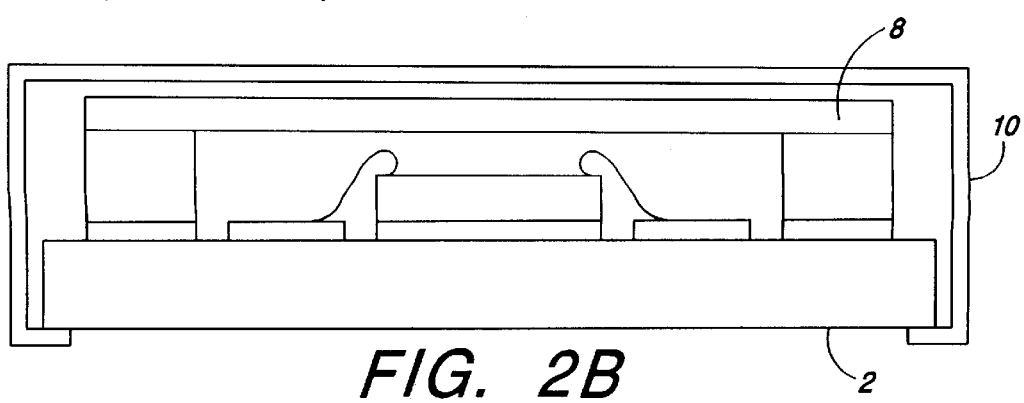
FIG. 2B is a cross-section of the electronic semiconductor device package shown in FIG. 2B across line A—A.
Figure 3A:
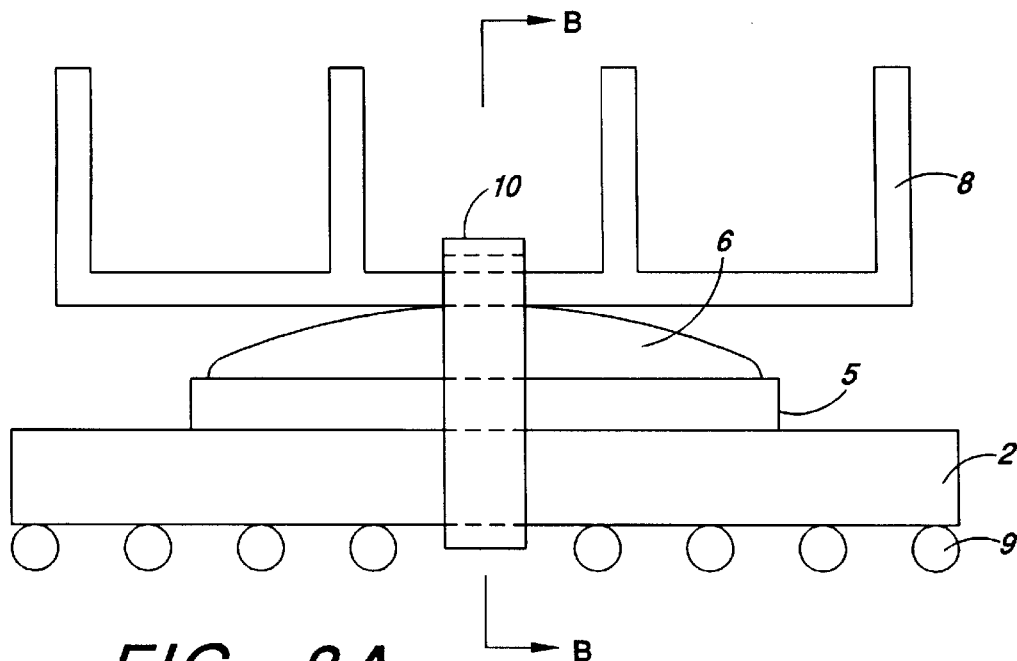
FIG. 3A is a side view of an electronic semiconductor device package with a heat sink attached by a clip.
Figure 3B:
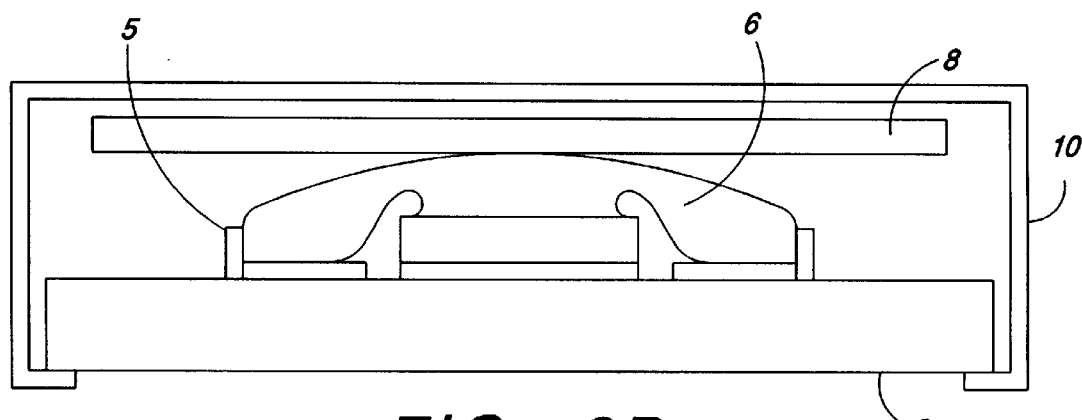
FIG. 3B is a cross-section of the electronic semiconductor device package shown in FIG. 3A across line B—B.
Figure 4A:
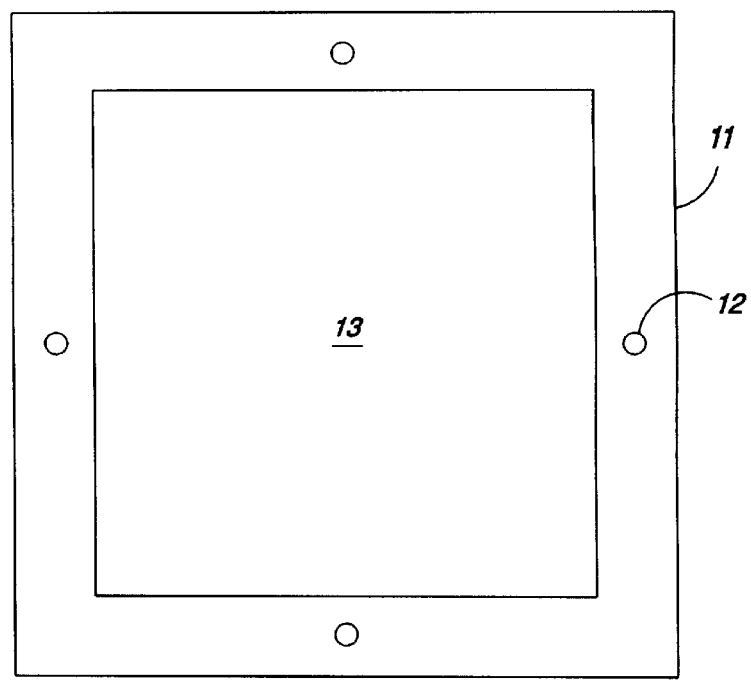
FIG. 4A is a top view of one embodiment of a stiffener.
Figure 4B:
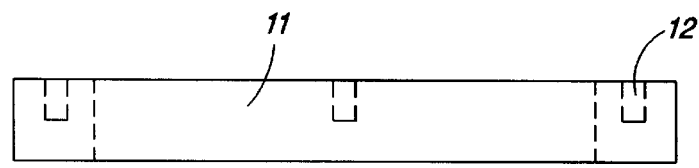
FIG. 4B is a side view of the stiffener shown in FIG. 4A.
Figure 4C:
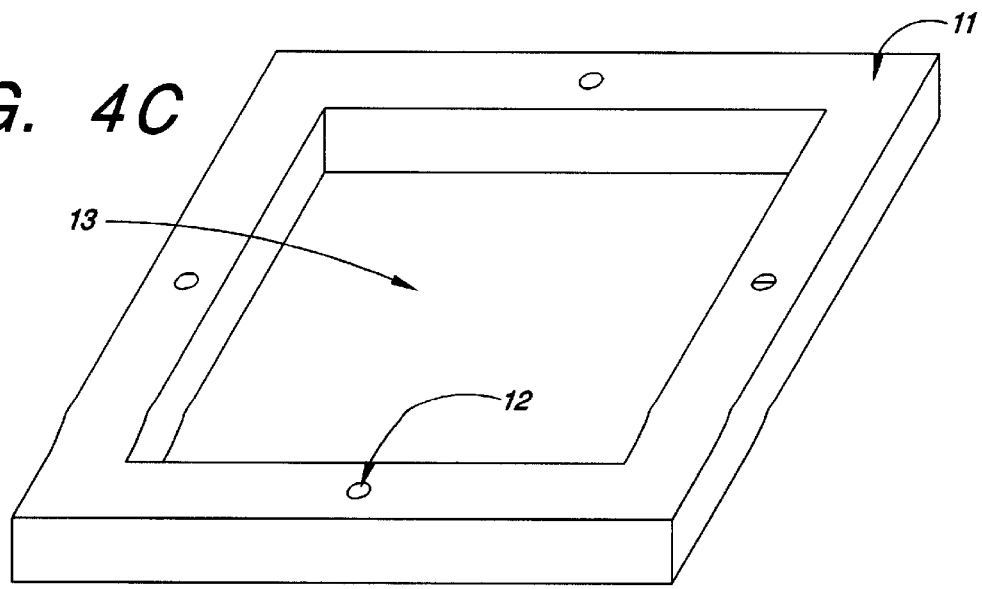
FIG. 4C is a perspective view of the stiffener shown in FIGS. 4A and 4B.

Referring to FIGS. 4A, 4B and 4C, an embodiment of the stiffener of the present invention is shown. FIG. 4A is a top view of the stiffener, while FIGS. 4B and 4C are side and perspective views, respectively. In this embodiment, the stiffener 11 has a hole 12 located along each edge of the stiffener 11. Further, the stiffener 11 has an opening 13 for encapsulant. In this configuration, the stiffener 11 functions as a dam ring of the encapsulant which is placed in the opening 13. The stiffener 11 is sufficiently thick and wide to support a semiconductor package to reduce or prevent package warpage. Heat dissipaters are attached to the stiffener by pins which protrude from the heat dissipater for insertion into the holes of the stiffener. Alternative embodiments of heat dissipaters are fully discussed below.

The heat dissipater attachment stiffener of the present invention is used with any electronic device or system which benefits from being cooled. In particular, the stiffener is used with electronic semiconductor packages which comprise: a silicon chip (die), reference character 1 in FIG. 7B; a substrate 2; first level interconnects 4 which connect the die 1 to the traces 3 of the substrate 2; and second level interconnects 9 which connect the substrate 2 to printed wiring circuit cards, not shown. The die is attached to the substrate by any known die attach means 1a such as silver-filled epoxy, solder or epoxy. The substrate comprises upper conductive traces 3 which electrically connect to conductive traces on the bottom of the substrate by electrically conductive vias. The vias pass through the substrate to complete the connection between the first level interconnects and second level interconnects. In some embodiments, the semiconductor device package comprises any first level interconnect device known to those of skill, such as wirebonds, Tape Automated Bonds (TAB) and Controlled Collapse Chip Connection (C4 or flip chip bonds). Embodiments of the package also comprise known second level interconnects, such as external metal pins or solder balls. Electronic semiconductor device packages also comprise encapsulant 6 which coats the die 1 and the first level interconnects 4 for protection. With the encapsulant 6, the package is sometimes referred to as a "glob-top" package.

Figure 5A:
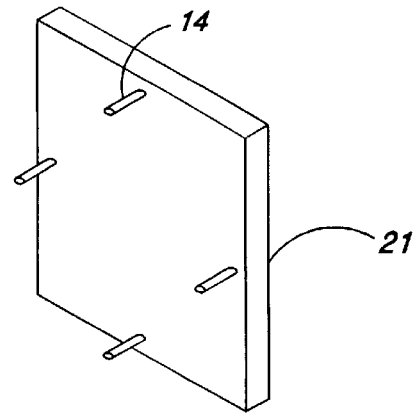
FIG. 5A is a perspective view of a heat spreader lid having pins.
Figure 5B:
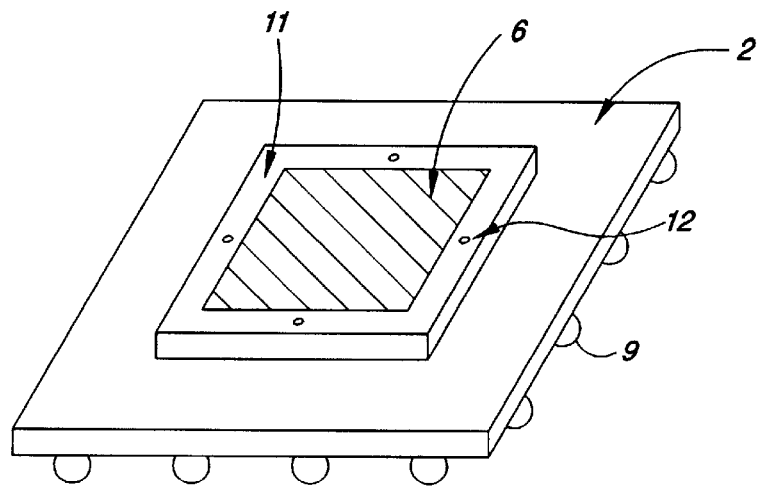
FIG. 5B is a perspective view of a stiffener attached to the substrate of a package, wherein the stiffener has an opening filled with encapsulant.
Figure 5C:
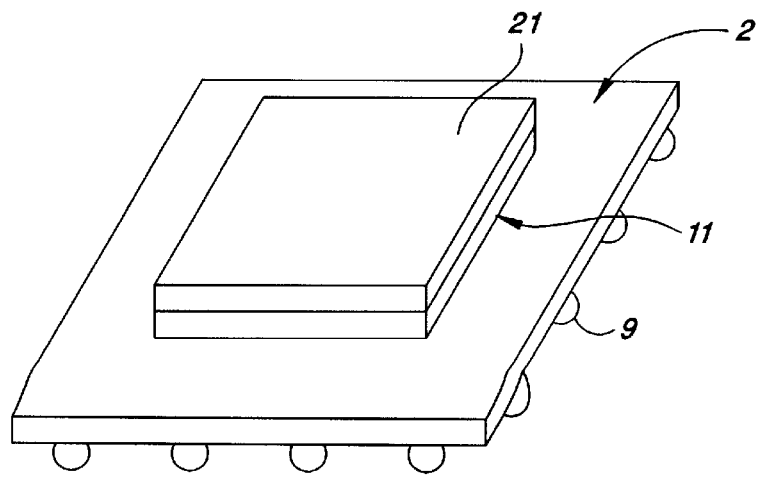
FIG. 5C is a perspective view of the heat spreader lid shown in FIG. 5A assembled with the stiffener and package shown in FIG. 5B.

Referring to FIG. 5A, a perspective view of a heat spreader lid embodiment of the invention is shown. The heat spreader lid 21 is flat and square similar to the outside dimension of the stiffener shown in FIGS. 4A through 4C. The heat spreader lid comprises pins 14 which protrude perpendicularly from the lower surface of the heat spreader lid. While four pins 14 are shown, alternative embodiments comprise any number of pins. FIG. 5B is a perspective view of a stiffener 11 attached to a package substrate 2. Encapsulant 6 is filled into the inner opening of the stiffener. The stiffener comprises four holes 12, one at the center of each side of the stiffener 11. Alternative embodiments of the stiffener comprise any number of holes. Similarly, alternative heat dissipaters comprise any number of pins. FIG. 5C is a perspective view of the heat spreader lid 21 of FIG. 5A attached to the stiffener 11 of FIG. 5B.

In an alternative embodiment, the heat spreader lid is made of metal and is attached to the package to provide heat conduction to an external heat sink. The external heat sink is attached to the heat spreader lid by using double sided tape or an epoxy.

Figure 6A:
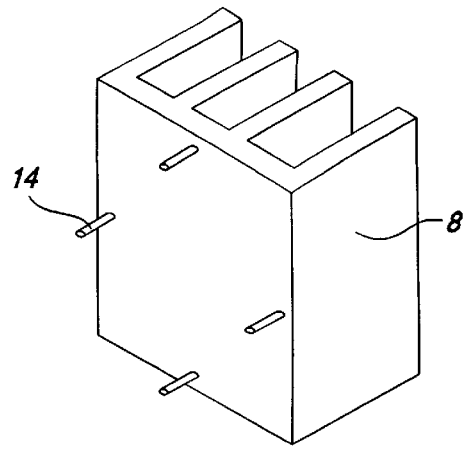
FIG. 6A is a perspective view of a heat sink having pins.
Figure 6B:
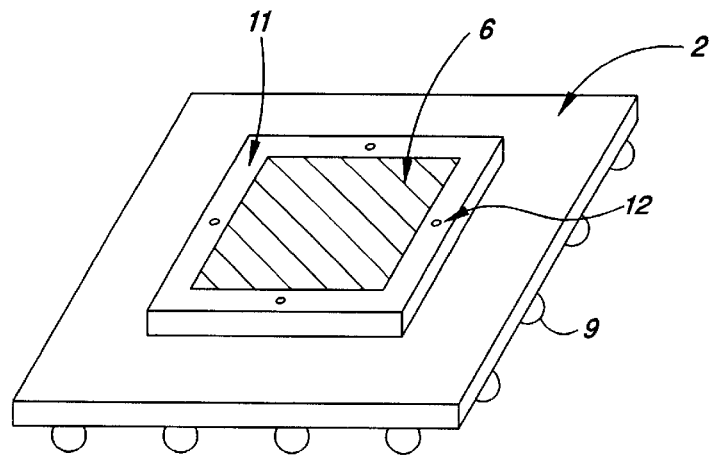
FIG. 6B is a perspective view of a stiffener attached to the substrate of a package, wherein the stiffener has an opening filled with encapsulant.
Figure 6C:
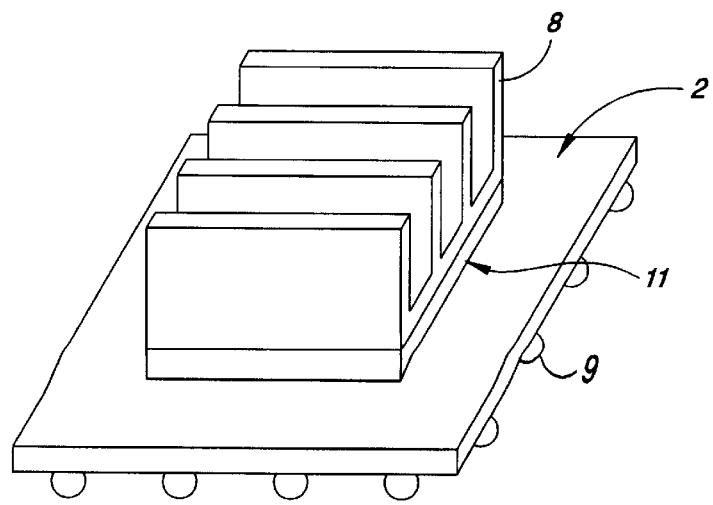
FIG. 6C is a perspective view of the heat sink shown in FIG. 6A assembled with the stiffener and package shown in FIG. 6B.

Referring to FIG. 6A, a perspective view of a heat sink embodiment of the invention is shown. The heat sink 8 comprises a flat, square, horizontal base member and four vertical heat exchanging fins which extend perpendicularly from the base member. The size and shape of the base member of the heat sink 8 is similar to the outside dimension of the stiffener shown in FIGS. 4A through 4C. The heat sink comprises pins 14 which protrude perpendicularly from the lower surface of the base member. While four pins 14 are shown, alternative embodiments comprise any number of pins. FIG. 6B is a perspective view of a stiffener 11 attached to a package substrate 2. Encapsulant 6 is filled into the inner opening of the stiffener. The stiffener comprises four holes 12, one at the center of each side of the stiffener 11. FIG. 6C is a perspective view of the heat sink 8 of FIG. 6A attached to the stiffener 11 of FIG. 6B.

Figure 7A:
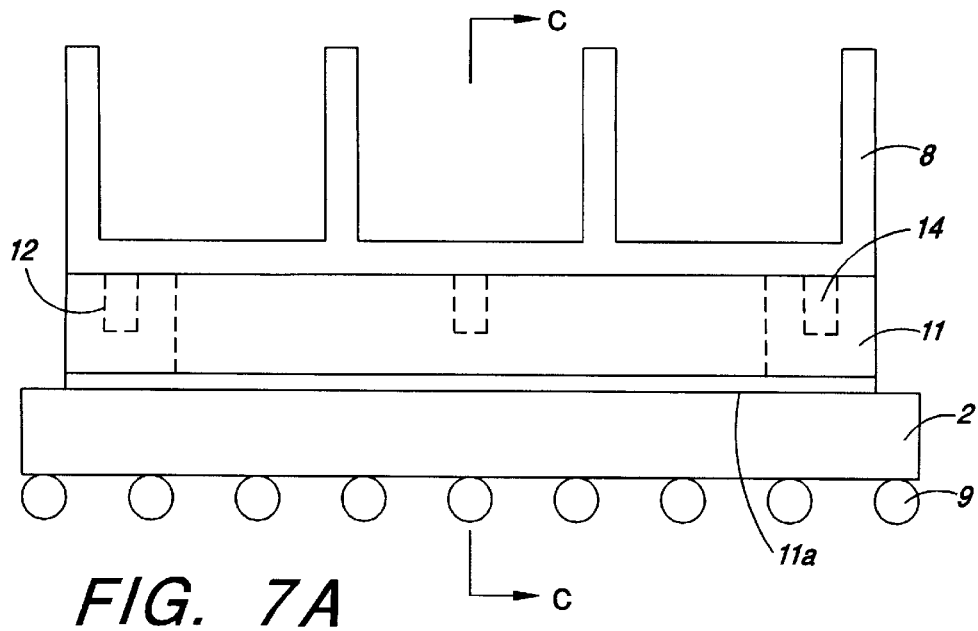
FIG. 7A is a side view of a semiconductor chip package with a heat sink attached to a stiffener by pins and holes.
Figure 7B:
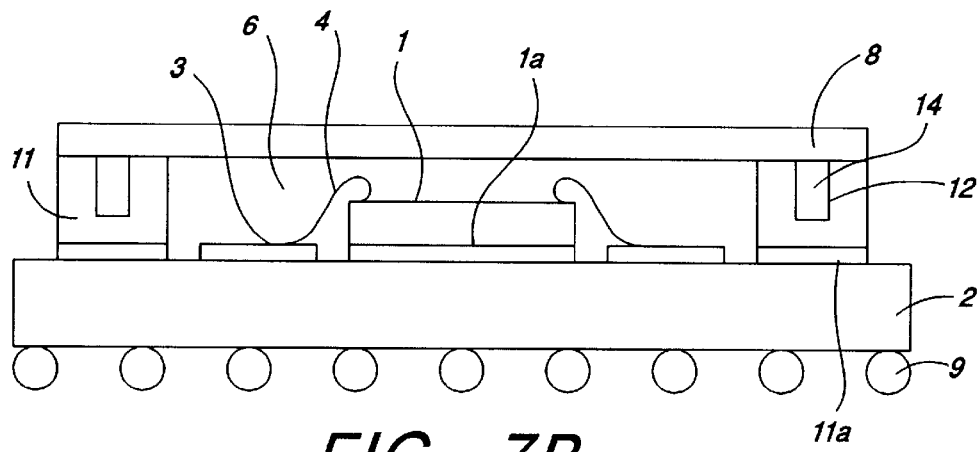
FIG. 7B is a cross-section of the electronic semiconductor device package shown in FIG. 7A across line C—C.

Referring to FIGS. 7A and 7B, an electronic semiconductor package is shown with an attached heat sink. FIG. 7B is a cross-sectional view of the semiconductor package shown in FIG. 7A across line C—C. For purposes of discussion, the die 1 of the semiconductor package is attached by wire bond first level interconnects 4 to the traces 3 of the substrate 2. However, the present invention may be used with any semiconductor package configuration. An embodiment of the stiffener 11 is attached to the substrate 2 and surrounds the die 1 and bond wires 4. The stiffener 11 also serves as a dam ring to enclose encapsulant 6 in the opening 13 (see FIG. 4A) of the stiffener 11. A heat sink 8 is adjacent the encapsulant 6 and the stiffener 11. The heat sink 8 is secured in place by pins 14 which protrude from the base member of the heat sink 8 into holes 12 in the stiffener 11.

A package is assembled by first attaching the die 1 to the substrate 2. Next, the first level interconnects 4 are secured to electrically connect the pads on the die 1 to the upper traces 3 on the substrate 2. As shown in FIGS. 5B and 6B, a stiffener 11 is then attached to the substrate 2 and liquid encapsulant 6 is poured over the die 1 and first level interconnects 4 within the stiffener 11. The encapsulant 6 is allowed to solidify by a curing process. Second level interconnects 9 are then attached to the bottom surface of the package substrate 2. Next, as shown in FIGS. 5C and 6C, respectively, either a heat spreader lid 21 or a heat sink 8, is placed adjacent the stiffener 11 and the encapsulant 6 with pins 14 protruding into the holes 12 of the stiffener 11.

Because the stiffener 11 also functions as a dam ring, there is no need to use a dam ring during the encapsulation process. As encapsulant is poured into the opening of the stiffener 11, the stiffener pools the encapsulant. A suitable encapsulant is found in an epoxy, such as Hysol FP4450, produced by Dexter Corp. If the encapsulant is filled to the top of the stiffener, a uniform surface is created which extends from one upper edge of the stiffener, across the encapsulant and finally to the opposite upper edge of the stiffener. This controlled encapsulant process provides a flat surface interface for complete interaction with the heat sink. The thermal connection is further improved by a layer of thermally conductive material, e.g., silicone grease or paste. One suitable grease is "OMEGATHERM" produced by Omega Corporation. Alternatively, a thermal tape, such as "T—Flex" produced by Thermagon, Inc., may be used. Finally, the thermally conductive material may be a phase change material, which is solid while the package is cool, but liquid as the package heats up. One phase change material is "T—Pli 205- AO" also produced by Thermagon, Inc. The thermally conductive material fills gaps between the encapsulant and the heat sink.

In the embodiments of the invention shown, holes 12 are positioned at each side of the stiffener to allow the heat sink 8 or heat spreader lid 21 to be attached in multiple directions. Further, while the embodiment of the stiffener 11 shown in the figures is rectangular, alternative stiffeners are disc shaped or shaped similar to the particular semiconductor device package with which the stiffener is being used. In different embodiments, the stiffener is made of powdered metal or thermally-conductive material such as aluminum, copper, copper/tungsten, plastic or any other known material.

Any heat sink configuration known in the art may be used in conjunction with the stiffener of the present invention. Examples of heat sink configurations include: pin, fin and ducted heat sinks. The pin configurations provide a plurality of parallel cooling fins which rise vertically from a horizontal surface or base member. The pins themselves comprise various cross-sections and longitudinal shapes. The fin heat sinks have vertical fins, of many possible cross-sections, which rise from a horizontal base member. The ducted heat sinks comprise a horizontal top member which is attached to the pins or fins opposite the horizontal base member. Embodiments of the heat sink are formed with powdered metal or thermally-conductive material such as aluminum, copper, copper/tungsten, plastic or any other known material.

The stiffener 11 is attached to the substrate 2 by any means known to those of skill in the art. For example, in one embodiment, the stiffener 11 is attached by a known silicone-based epoxy 11a (see FIGS. 7A and 7B) disposed between the bottom surface of the stiffener 11 and the upper surface of the substrate 2. Alternatively, the stiffener 11 is attached to the substrate by double sided adhesive tape 11a also known in the art. Further, the stiffener 11 is attached by screws which extend into both the stiffener and the substrate. In a still further embodiment, the stiffener 11 is attached to the substrate 2 by the encapsulant 6 itself. This embodiment is described in greater detail with respect to FIG. 8.

Figure 8:
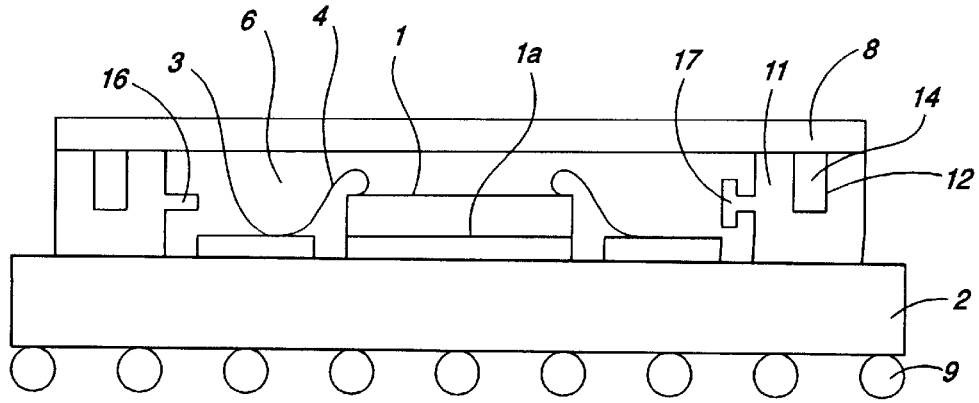
FIG. 8 is a cross-section of a stiffener embodiment of the invention comprising a protrusion for anchoring the stiffener to the encapsulant.

As shown in FIG. 8, the stiffener 11 is provided with a protrusion 16 which extends into the interior of the stiffener 11 toward the die 1. During the encapsulation process, encapsulant 6 flows around the protrusion 16 and, once hardened, secures the stiffener 11 to the substrate 2. Numerous suitable protrusions will occur to those of skill in the art. For example, in one embodiment, the protrusion 16 comprises a single protrusion which extends around the entire circumference of the opening 13 (see FIG. 4A) for the encapsulant 6. Alternatively, the protrusion 16 comprises separate, individual protrusions which are located at various points around the opening. Additionally, as shown in FIG. 8, some embodiments of the protrusion 16 comprise ridges 17 at the distal end of the protrusion 16 which extend above and below the protrusion to ensure engagement between the protrusion 16 and the encapsulant 6.

Figure 9:
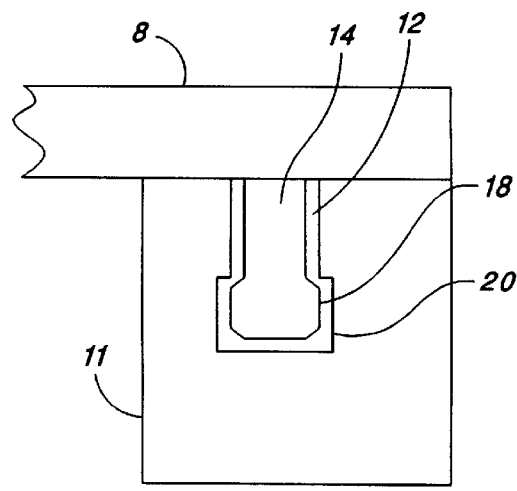
FIG. 9 is a cross-section of a pin which extends from a heat spreader lid and a hole in a stiffener which receives the pin.

Referring to FIG. 9, the drawing shows a cross-sectional side view of an embodiment of a pin and hole attachment. The pin 14 comprises a long cylindrical shaft portion which extends from the bottom surface of the heat sink 8. An annular bulge 18 extends from the distal end of the shaft. The outside diameter of the bulge is larger than the outside diameter of the shaft. The hole 12 in the stiffener 11 comprises a cylindrical upper portion which extends from the top surface down into the stiffener 11. At the bottom of the cylindrical portion, the hole 12 comprises an expanded hole portion 20 which has a larger diameter than the cylindrical upper portion. In this embodiment, the bulge 18 on the pin 14 has a slightly larger outside diameter than the diameter of the cylindrical upper portion of the hole 12 and is made of an elastically deformable material. When the pin 14 is first placed in the hole 12, the bulge is squeezed by the cylindrical upper portion of the hole 12. As the pin 14 is fully inserted in the hole 12, the bulge 18 is pushed into the expanded hole portion 20 so that it springs back to its original shape. The bulge 18 and expanded hole portion prevent the heat sink 8 from prematurely disengaging from the stiffener 11.

In alternative embodiments, the particular shapes of the pin and hole are made to provide a desired resistance to removal of the pin from the hole. In particular, the hole is sometimes conically shaped, tapering from top to bottom, so as to squeeze the pin with increased force the further the pin is pushed into the hole. In some embodiments, the pin and hole are configured to provide a permanent attachment, while others render the heat sink easily removable.

Figure 10:
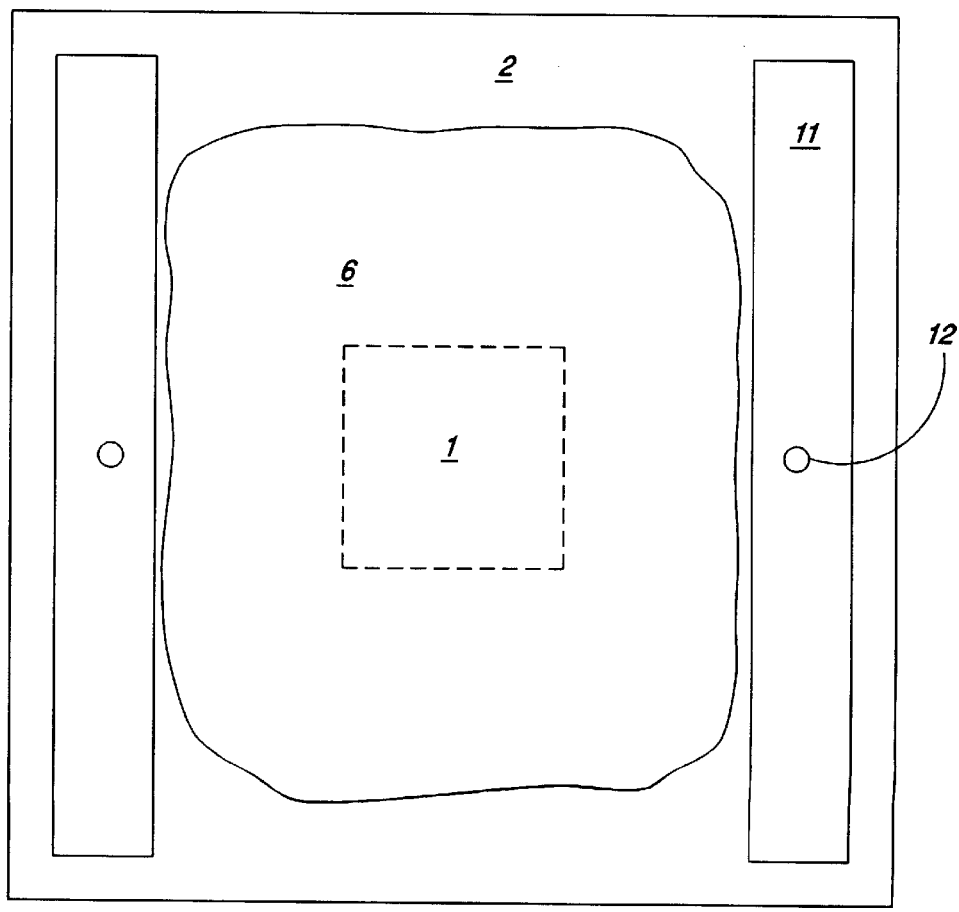
FIG. 10 is a top view of a "glob-top" electronic semiconductor package with two stiffeners.

Referring to FIG. 10, a top view of an embodiment of the invention is shown wherein two stiffeners are attached to the semiconductor package. Again, the semiconductor chip package comprises a substrate 2. The die 1 is attached to the substrate 2 in a central location. A mound of encapsulant or "glob-top" 6 covers the die 1 and the central portion of the substrate 2. Two individual stiffeners 11 are attached to opposite ends of the package. Each of the stiffeners 11 has a hole 12 centrally located in the stiffener. Similar to the previous embodiments, a heat sink or heat spreader lid, not shown, is attachable to the stiffeners 11 by pins which are engagable with the holes 12. When the heat sink or heat spreader lid is attached to the stiffeners 11, a gap exists between the substrate and the perimeter of the heat sink or lid where the heat sink or lid is not supported by the stiffeners 11. Therefore, one heat sink or lid which could be used with the two stiffener configuration comprises steps at opposite sides of the heat sink or lid. The steps extend from the bottom surface of the heat sink to the substrate at the perimeter of the heat sink where it is not supported by the stiffeners. Of course, it is important that the step be placed at the perimeter so as not to interfere with the encapsulant 6. This improves the thermal conduction path between the substrate and the heat sink or heat spreader lid.

Figure 11:
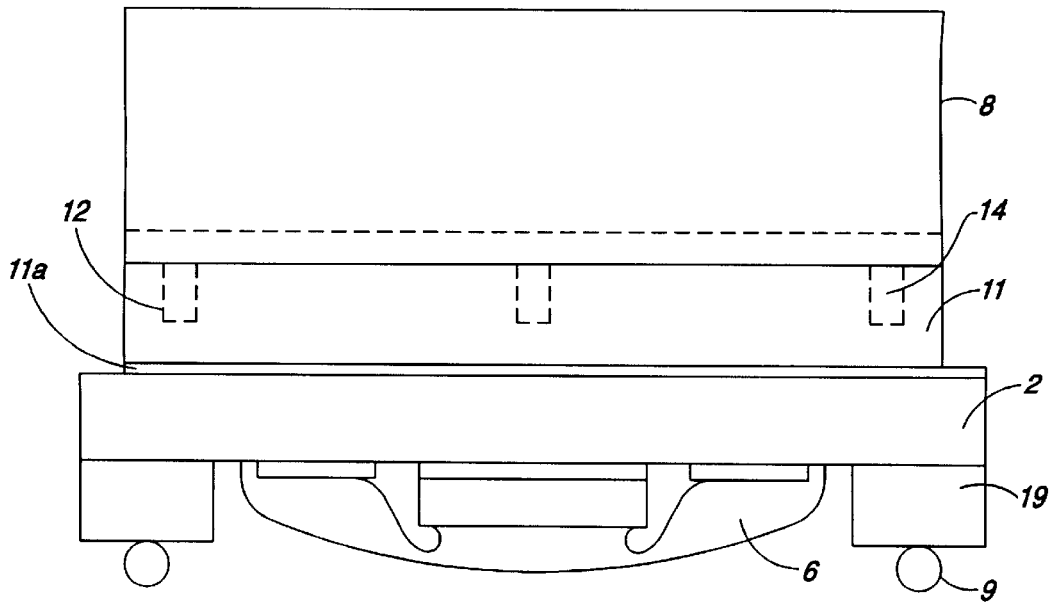
FIG. 11 is a side view of a stiffener embodiment of the invention attached to a cavity down semiconductor device package.

Referring to FIG. 11, a cross-section of a cavity-down semiconductor package is shown. The components of the cavity-down package are similar to the cavity-up configurations previously discussed, except the die and first level interconnects are positioned on the underside of the substrate, i.e, the side which faces the printed wiring board. Also, additional lamination layers 19 may be added to the substrate to support the second level interconnects. In this embodiment, the stiffener 11 does not require an opening for encapsulant because the die 1 is on the opposite side of the substrate. As before, the stiffener 11 is provided with holes 12 for receiving the pins 14 of a heat sink or heat spreader lid. This allows the heat sink 8 (or lid) to be firmly attached to the stiffener 11.

Figure 12:
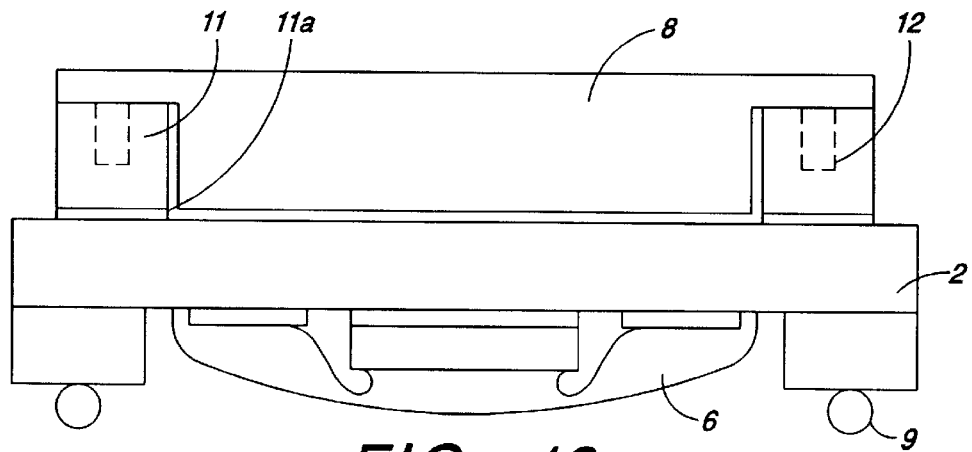
FIG. 12 is a cross-section view of an alternative embodiment of the invention attached to a cavity down electronic semiconductor device package.

Referring to FIG. 12, an alternative embodiment of the invention for attaching a heat sink to a cavity down semiconductor package is shown. In this embodiment, the stiffener 11 comprises an opening similar to the opening 13 shown in FIG. 4A. However, rather than filling the interior of the opening with encapsulant, the heat sink 8 protrudes into the opening. As before, pins and holes secure the heat sink 8 to the semiconductor chip package. As with all of these embodiments, thermal grease or double sided thermally conductive tape is applied between the heat sink 8 and the substrate 2 to improve the thermal conduction of the pathway.

Figure 13:
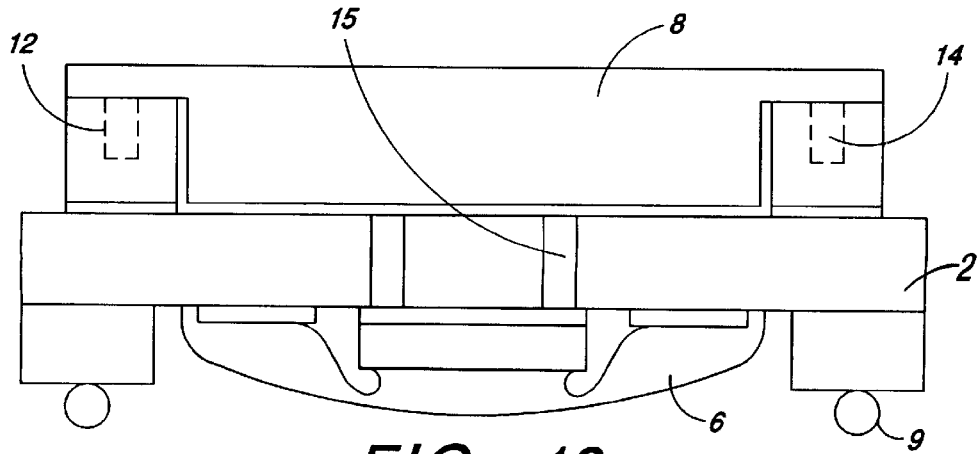
FIG. 13 is a cross-section view of an alternative embodiment of the invention attached to a cavity down electronic semiconductor device package wherein the substrate comprises thermally conductive vias.

As shown in FIG. 13, a further embodiment of the invention comprises thermally conductive vias. The vias 15 extend through the substrate 2 from the die 1 to the heat sink 8. The vias 15 are filled with a thermally conductive material, such as copper, silicon carbide or aluminum nitride, which provides a path for thermal conduction through the substrate from the die to the heat sink 8. Alternatively, the vias 15 comprise a large single via approximately the same size width as the die.

While the particular embodiments for electronic semiconductor device packages as herein shown and disclosed in detail are fully capable of obtaining the objects and advantages herein before stated, it is to be understood that they are merely illustrative of the presently preferred embodiments of the invention and that no limitations are intended by the details of construction or design herein shown other than as described in the appended claims.

I claim:

1. An electronic semicondtictor device package, said package comprising:
   a substrate having a shape and traces;
   a die attached to said substrate;
   a first level interconnects electrically coupling said die to the traces of said substrate;
   a plurality of stiffeners attached to said substrate, wherein each stiffener comprises:
      a bottom portion attached to said substrate;
      a top portion with at least one hole, the hole extending through the stiffener such that at least part of the hole intersects a plane that is both perpendicular to the substrate and intersects the substrate:
   heat dissipater adjacent each of said stiffeners; and
   a plurality of pins that protrude from said heat dissipater, each of said plurality of pins engaging the hole of one of said stiffeners, whereby the pins and the holes secure said heat dissipater to said stiffeners.

2. A package as in claim 1, wherein each stiffener of the plurality comprises a shape similar to said substrate.

3. A package as in claim 1, wherein each stiffener of the plurality comprises an opening for encapsulant, whereby the plurality of stiffeners functions as a dam ring.

4. A package as in claim 3, wherein each stiffener of said plurality comprises at least one hole.

5. A package as in claim 1, wherein said heat dissipater comprises a flat heat spreader lid.

6. A package as in claim 1, wherein said heat dissipater comprises a heat spreader lid thermally coupled to a heat sink.

7. A package as in claim 1, wherein said hole comprises a upper portion and a lower expanded hole portion, and wherein said pin comprises a bulge at the distal end of said pin, wherein said bulge is engagable with said expanded hole portion.

8. A system for attaching a heat dissipater to an electronic semiconductor device package, the system comprising:
   a substrate;
   a stiffener of the electronic package comprising:
      a bottom portion attachable to said substrate;
      a top portion with at least one hole, the hole extending through the stiffener such that at least part of the hole is configured to intersect a plane that is both perpendicular to the bottom portion and intersects the bottom portion; and
   a heat dissipater comprising at least one pin, wherein the pin engagable with the hole, the hole comprising an upper portion and a lower expanded hole portion, the pin comprising a bulge at a distal end of said pin, wherein said bulge is engageable with said expanded hole portion.

9. A system as in claim 8, further comprising a plurality of stiffeners, wherein each stiffener of said plurality is attachable to the package.

10. A system as in claim 9, wherein each stiffener of said plurality comprises at least one hole and wherein said heat dissipater comprises a plurality of pins.

11. A system as in claim 8, wherein said stiffener is rectangular.

12. A system as in claim 8, further comprising an opening in said stiffener for encapsulant, whereby the stiffener functions as a dam ring.

13. A method of attaching a heat dissipater to an electronic semiconductor device package, said method comprising:
   attaching a stiffener to the package, wherein the stiffener comprises:
      a bottom portion attached to said substrate;
      a top portion with at least one hole, the hole extending through the stiffener such that at least part of the hole intersects a plane that is both perpendicular to the substrate and intersects the substrate; and
   positioning a heat dissipater adjacent the stiffener, wherein the heat dissipater comprises at least one pin; and
   engaging the pin with the hole, wherein the heat dissipater is secured to the stiffener by the pin and hole, the hole comprising an upper portion and a lower expanded hole portion, the pin comprising a bulge at a distal end of said pin, wherein the bulge engages the expanded hole portion.

14. A method as in claim 13, wherein said attaching comprises pouring liquid encapsulant into an opening in the stiffener, whereby the stiffener functions as a dam ring.

15. A method as in claim 13, wherein said engaging comprises permanently fixing the pin in the hole.

16. An electronic semiconductor device package, said package comprising:
   a substrate having a top and bottom surface and having traces;
   a die attached to the top surface of said substrate;
   first level interconnects electrically coupling said die to the traces of said substrate;
   a stiffener comprising:
      a bottom portion attached to said substrate;
      a top portion with at least one hole, the hole extending through the stiffener such that at least part of the hole intersects a plane that is both perpendicular to the substrate and intersects the substrate;
      an opening that houses said die;
   encapsulant within the opening of said stiffener which covers said die and first level interconnects; and
   a heat dissipater adjacent said stiffener and encapsulant, wherein said heat dissipater comprises at least one pin that protrudes from said heat dissipater and engages the hole of said stiffener, the hole comprising an upper portion and a lower expanded hole portion, the pin comprising a bulge at a distal end of said pin, wherein the bulge engages the expanded hole portion, whereby said pin and hole secure said heat dissipater to said stiffener.

17. An electronic semiconductor device package, said package comprising:
   a substrate having a shape and traces;
   a die attached to said substrate;
   first level interconnects electrically coupling said die to the traces of said substrate;

a stiffener comprising:
- a bottom portion attached to said substrate;
- a top portion with at least one hole, the hole extending through the stiffener such that at least part of the hole intersects a plane that is both perpendicular to the substrate and intersects the substrate;

a heat dissipater adjacent said stiffener; and a pin that protrudes from said heat dissipater and engages the hole of said stiffener, whereby the pin and the hole secure said heat dissipater to said stiffener.

18. An electronic semiconductor device package, said package comprising:

a substrate having a shape attaches;

a die attached to said substrate;

first level interconnects electrically coupling said die to the traces of said substrate;

a stiffener comprising:
- a bottom portion attached to said substrate;
- a top portion with at least one hole, the hole extending through the stiffener such that at least part of the hole intersects a plane that is both perpendicular to the substrate and intersects the substrate;

a heat dissipater adjacent said stiffener; and a pin that protrudes from said heat dissipater and engages the hole of said stiffener, the hole comprising an upper portion and a lower expanded hole portion, the pin comprising a bulge at a distal end of said pin, wherein said bulge is engagable with said expanded hole portion whereby the pin and the hole secure said heat dissipater to said stiffener.

19. An electronic semiconductor device package, said package comprising:

a substrate having a shape and traces;

a die attached to said substrate;

first level interconnects of said die to the traces of said substrate;

a plurality of stiffeners attached to said substrate, wherein each stiffener comprises at least one hole and is attached to the substrate;

a heat dissipater adjacent said stiffener, the heat dissipater comprising a heat sink with at least one fin; and a pin that protrudes from said heat dissipater and engages the hole of said stiffener, the hole comprising an upper portion and a lower expanded hole portion, the pin comprising a bulge at a distal end of said pin, wherein said bulge is engageable with said expanded hole portion whereby the pin and the hole secure said heat dissipater to said stiffener.

* * * * *